United States Patent
Netsu et al.

[11] Patent Number: 6,099,748
[45] Date of Patent: Aug. 8, 2000

[54] SILICON WAFER ETCHING METHOD AND SILICON WAFER ETCHANT

[75] Inventors: Shigeyoshi Netsu; Bee Chin Lim, both of Kuala Lumpur; Yee Ping Yap, Selangor DE, all of Malaysia

[73] Assignee: Shin-Etsu Handotai Co., Ltd., Tokyo, Japan

[21] Appl. No.: 09/207,194

[22] Filed: Dec. 8, 1998

[30] Foreign Application Priority Data

Dec. 11, 1997 [MY] Malaysia ............................ PI 970 5978

[51] Int. Cl.[7] .............................. B44C 1/22; C09K 13/00; C09K 13/06
[52] U.S. Cl. ............................ 216/99; 134/1.3; 252/79.1; 252/79.5
[58] Field of Search .................... 252/79.1, 79.5; 134/1.3; 216/99

[56] References Cited

U.S. PATENT DOCUMENTS

| | | | |
|---|---|---|---|
| 5,411,919 | 5/1995 | Inada | 437/209 |
| 5,494,862 | 2/1996 | Kato et al. | 437/249 |
| 5,679,212 | 10/1997 | Kato et al. | 156/636.1 |
| 5,810,994 | 9/1998 | Lee et al. | 205/656 |

FOREIGN PATENT DOCUMENTS

| | | |
|---|---|---|
| 742583 | 11/1996 | European Pat. Off. . |
| 761599 | 3/1997 | European Pat. Off. . |
| 06349795 | 12/1994 | Japan . |
| 08316191 | 11/1996 | Japan . |
| 09129624 | 5/1997 | Japan . |
| 09266193 | 7/1997 | Japan . |
| 10092777 | 4/1998 | Japan . |
| 151636 | 9/1990 | Poland . |

OTHER PUBLICATIONS

"Alkali Etching Solutions for Silicon Wafers", Jaskolska et, al.; PL–151,636; Sep. 28, 1990; Abstract.

Primary Examiner—William Powell
Assistant Examiner—George Goudreau
Attorney, Agent, or Firm—Hogan & Hartson LLP

[57] ABSTRACT

There is disclosed a silicon wafer etching method in which etching is performed through use of an etchant. The etchant is an alkali aqueous solution which contains an alkali component in a concentration ranging from 50.6% to 55.0% by weight. The alkali component is preferably sodium hydroxide. The silicon wafer etching method can reduce not only surface roughness but also dispersion thereof.

10 Claims, 1 Drawing Sheet

SILICON WAFER ETCHING METHOD AND SILICON WAFER ETCHANT

BACKGROUND OF THE INVENTION

1. Field of the Invention

The present invention relates to a silicon wafer etching method capable of eliminating mechanical damage due to machining, such as slicing, chamfering, and lapping, in a silicon wafer manufacturing procedure, as well as to a silicon wafer etchant for use in the method.

2. Description of the Related Art

Conventionally, silicon wafers, from which are manufactured integrated circuits such as ICs and LSIs and discrete semiconductor devices such as transistors and diodes, are manufactured in the steps of: slicing a single crystal obtained by the Czochralski method (CZ method) or the floating zone method (FZ method) through use of an inner diameter slicer or a wire saw; chamfering the peripheral edges of the sliced wafers; lapping the main surfaces of the wafers through use of free abrasive in order to improve flatness; wet-etching the wafers in order to eliminate mechanical damage induced from machining in the preceding steps; and mirror-polishing the etched wafers.

Wet etching to eliminate such mechanical damage from wafers is classified into acid etching, which uses a mixed acid consisting of, for example, hydrofluoric acid, nitric acid, and acetic acid; and alkali etching, which uses an aqueous solution of alkali such as sodium hydroxide, potassium hydroxide, or the like.

Acid etching can control an etch rate and the state of an etched surface through variation of the composition of a mixed acid, but the etch rate is generally high, thus involving difficulty in maintaining wafer flatness which has been improved through lapping.

On the other hand, alkali etching is advantageous for obtaining good flatness of etched wafers since the etch rate is relatively low. In recent years, a very high degree of flatness has been required of silicon wafers. Accordingly, alkali etching has been widely used because of the advantageous feature.

However, an alkali etchant acts to determine the reaction rate and has etch selectivity in which the etch rate of a (100) plane is 60–100 times that of a (111) plane. Accordingly, alkali etching involves a problem of the formation of roughness on an etched surface caused by this etch selectivity.

Specifically, when the roughness of the etched surface is large, projected portions thereof cause a problem that they chip off during manufacture of devices to become particles, while depressed portions require a high degree (or large amount) of polishing, resulting in reduced productivity in a polishing step.

Particularly, since the circumference of a wafer is usually chamfered through use of fixed diamond abrasive grains, in the subsequent lapping step, the chamfered portion is damaged due to contact between a carrier used to hold the wafer and the edge portion of the wafer. As a result, if this wafer is subjected to alkali etching, the surface roughness of the appropriately chamfered portion deteriorates.

In recent manufacture of LSIs, in order to prevent particle generation from the chamfered portions of wafers, there have been used wafers whose chamfered portions are mirror-polished through use of polishing pad. An alkali-etched wafer requires much more time to mirror-polish a chamfered portion thereof as compared with an acid-etched wafer having a feature of relatively low surface roughness, so that alkali-etched wafers have a problem of low productivity in mirror-polishing chamfered portions thereof.

The chamfered portion of an alkali-etched wafer has not only a problem of high surface roughness but also a problem of large dispersion (variations) in surface roughness. Since a stock removal for mirror-polishing a chamfered portion must be set to a maximum value of surface roughness, large dispersion in surface roughness causes an increase in polishing time and consumption of polishing pad or polishing agent, resulting in reduced productivity and increased cost. Thus, there has been demand for reduction in not only surface roughness but also dispersion thereof.

SUMMARY OF THE INVENTION

The present invention has been accomplished to solve the above-mentioned problems, and a primary object of the invention is to provide a silicon wafer etching method capable of reducing not only surface roughness but also dispersion thereof.

Another object of the present invention is to provide a silicon wafer etchant for use in the silicon wafer etching method.

According to a first aspect of the present invention, there is provided a silicon wafer etching method comprising a step of etching a silicon wafer through use of an etchant, wherein the etchant is an alkali aqueous solution which contains an alkali component in a concentration ranging from 50.6% to 55.0% by weight.

By etching a wafer through use of an alkali aqueous solution as an etchant which contains an alkali component in a concentration ranging from 50.6% to 55.0% by weight, surface roughness of a chamfered portion and other portions of the etched wafer, particularly dispersion in a maximum value of surface roughness, can be significantly reduced. Accordingly, in the subsequent step of polishing the chamfered portion, a reduction in polishing time and consumption of polishing pad or polishing agent is realized, resulting in improved productivity and reduced cost.

Preferably, the alkali component is sodium hydroxide.

Through use of sodium hydroxide as the alkali component, the above-mentioned effect of reducing surface roughness of a chamfered portion, particularly dispersion in a maximum value of surface roughness, can be further improved. Also, since sodium hydroxide is inexpensive, the cost can be reduced further.

Preferably, the temperature of the etchant falls in a range from 65° C. to 85° C.

By maintaining the etchant within the above temperature range, etching can be performed at an appropriate rate (too low an etch rate impairs productivity, while too high an etch rate makes etch selectivity marked, with a resultant adverse effect on surface roughens). In addition, there are prevented apparatus-related problems associated with high temperatures of the etchant (when the etchant temperature is too high, the etchant is in danger of boiling and endangers a user who handles it).

Preferably, the thickness of silicon removed by the above etching method (etching amount) falls in a range of 15 $\mu$m to 40 $\mu$m in terms of a total thickness for both sides of a wafer.

A silicon wafer may be etched by a minimal amount required to eliminate mechanical damage, but is etched in an amount falling in the above-described range in consideration of variations in depth of penetration of the mechanical damage.

According to a second aspect of the present invention, there is provided a silicon wafer etchant comprising an alkali aqueous solution which contains an alkali component in a concentration ranging from 50.6% to 55.0% by weight.

Through use of such an etchant for alkali etching a silicon wafer, surface roughness of a chamfered portion, particularly dispersion in a maximum value of surface roughness, can be significantly reduced, as described above. Accordingly, in the subsequent steps, productivity can be improved, and cost can be reduced.

In the etchant, the alkali component is preferably sodium hydroxide.

Through use of an etchant which contains sodium hydroxide as the alkali component, the above-mentioned effect can be further improved, and the etchant can be obtained stably and inexpensively from the market.

DESCRIPTION OF THE PREFERRED EMBODIMENTS

Figure 1:
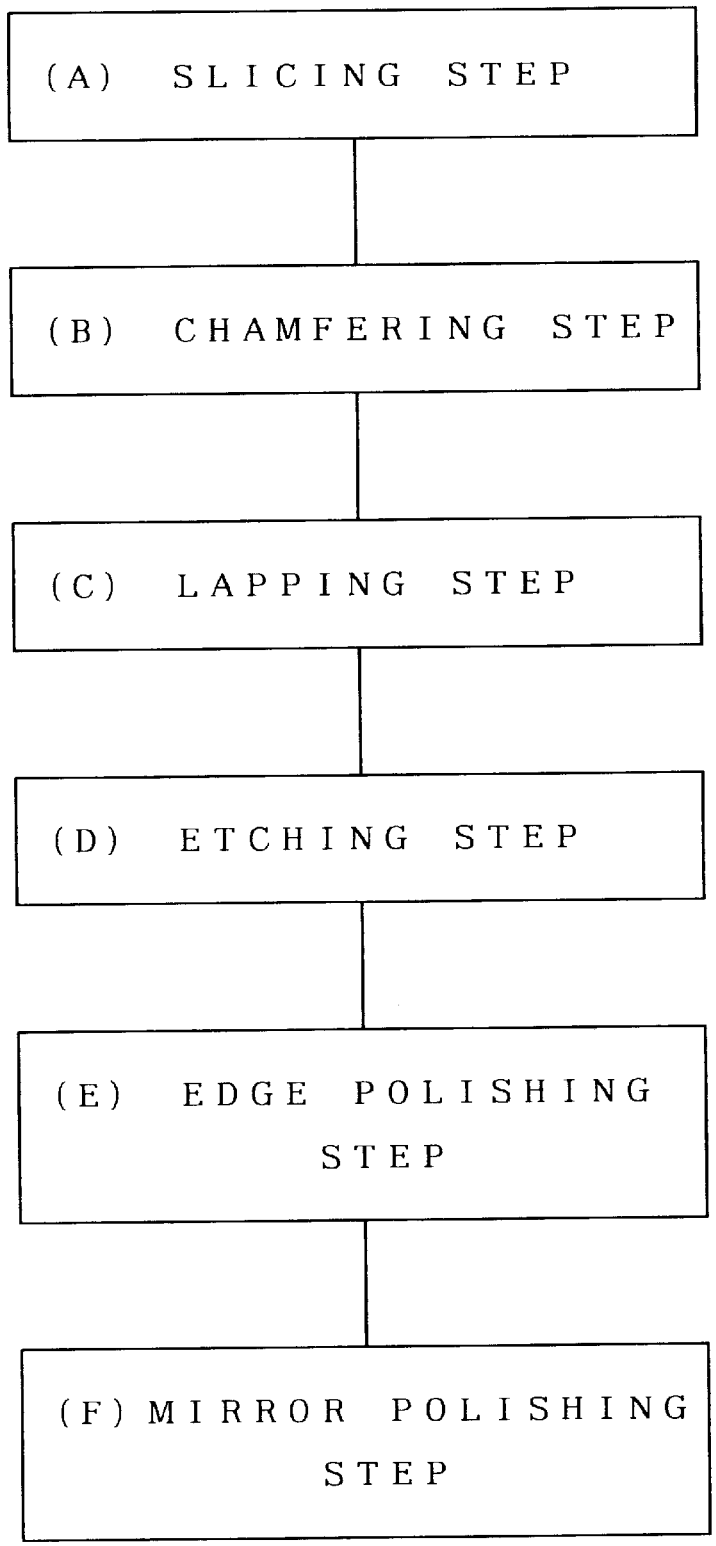
FIG. 1 is a flow chart illustrating a general process for manufacturing silicon wafers.

Embodiments of the present invention will next be described with reference to the drawing.

Conventionally, an etchant used for alkali etching contains an alkali component in a concentration of 48% to 50% by weight. An alkali aqueous solution which contains an alkali component in a concentration of greater than 50.5% by weight has not be used for alkali etching due to various problems including large dispersion in concentration, increase in heavy metal impurities contained in an etchant, and crystallization of an alkali component.

The inventors of the present invention have found that surface roughness of an etched silicon wafer, particularly its chamfered portion, and dispersion thereof can be reduced through use of an etchant which contains an alkali component in a concentration of 50.6% to 55.0% by weight. Based on the findings, the present invention has been achieved.

A theoretical explanation is not definite for an action that surface roughness of an etched silicon wafer, particularly of its chamfered portion, and dispersion in a maximum value thereof can be reduced through a slight increase in concentration of an alkali component. Probably, this is because an etch rate is maximized when etching is performed using an etchant which contains an alkali component in a concentration near 50% by weight. In other words, when etching is performed using an etchant which contains an alkali component in a concentration of 50.6% by weight or more, an etch rate reduces sharply, thereby reducing an effect of etch selectivity peculiar to alkali etching. Thus, etching can be performed uniformly, resulting in improved surface roughness.

A silicon wafer etchant of the present invention will now be described in detail.

FIG. 1 illustrates a general procedure for manufacturing silicon wafers.

A silicon ingot which has been grown by the Czochralski method or the floating zone method is first sliced into wafers through use of an inner diameter slicer or a wire saw in a slicing step (A) of FIG. 1. Next, in a chamfering step (B) of FIG. 1, in order to prevent the edge portion of a wafer from chipping, a wafer is chamfered. Then, in a lapping step (C) of FIG. 1, a chamfered wafer is lapped in order to make the wafer flat.

In a subsequent etching step (D) of FIG. 1, in order to eliminate mechanical damage induced from machining in the above-described preceding steps, a lapped wafer undergoes etching. Subsequently, an etched wafer undergoes an edge polishing step (E) of FIG. 1 so as to mirror-polish a chamfered edge portion thereof, and then a mirror polishing step (F) of FIG. 1 so as to mirror-polish either side or both sides of a wafer. Thus, mirror polished silicon wafers are obtained.

A silicon wafer etchant of the present invention is intended to be used in the aforementioned etching step where alkali etching is performed, and thus contains an alkali component in a concentration of 50.6% to 55.0% by weight.

When the alkali component concentration is lower than 50.6% by weight, an etch rate does not reduce much, and consequently surface roughness is not improved. By contrast, when the concentration is in excess of 55.0% by weight, an alkali component precipitates in an etching bath. Therefore, concentrations above 55.0% by weight are not preferred.

In view of the degree of improvement in surface roughness and precipitation of an alkali component as described above, the alkali component concentration is preferably 51.0% to 53.0% by weight, particularly preferably 51.0% to 51.5% by weight.

An alkali component used in an etchant of the present invention is not particularly limited so long as it can etch silicon, but is preferably a hydroxide of an alkali metal such as sodium hydroxide or potassium hydroxide in view of etching capability, particularly preferably sodium hydroxide.

In the present invention, these alkali components may be used singly or in combination. For example, sodium hydroxide and potassium hydroxide may be blended, or sodium hydroxide may be used singly.

Next, a silicon wafer etching method of the present invention will be described.

The silicon wafer etching method of the present invention is characterized in that the above-described etchant of the present invention is used. Silicon wafers are immersed in an etchant heated to a predetermined temperature and maintained at the temperature to thereby etch the wafers.

The temperature of an etchant is not particularly limited, but is preferably 65° C. to 85° C.

When the temperature of an etchant is lower than 65° C., an etch rate reduces, resulting in reduced productivity. By contrast, when the temperature of an etchant is in excess of 85° C., there arise apparatus-related problems; for example, the etchant is in danger of boiling and endangers a user who handles it. Also, there arise problems related to a reaction rate; for example, an etch rate increases sharply, so that etch selectivity becomes noticeable.

The thickness of silicon removed by an etching method of the present invention (etching amount or etching stock removal) is not particularly limited, but may be a minimal thickness required to eliminate mechanical damage in the lapping and preceding steps. However, in consideration of dispersion in depth of penetration of the mechanical damage, the etching amount falls in a range of 15 μm to 40 μm in terms of a total thickness for both sides of a wafer.

The thickness of silicon removed is controlled primarily through adjustment of time of immersion of a silicon wafer in an etchant. This immersion time, in turn, is set according to the relation between the aforementioned etching amount and the alkali component concentration of an etchant, and is preferably set such that the etching amount falls in a range of 15 μm to 40 μm. The immersion time is usually 5 to 20 minutes.

In order to uniformly etch silicon wafers, the wafers immersed in an etchant may be oscillated, or ultrasonic may be applied to the etchant as practiced conventionally.

EXAMPLES

The present invention will next be described by way of example, which should not be construed as limiting the invention.

Example

A p-type single crystal ingot having a diameter of approximately 200 mm (8 inches) and a resistivity of 10 Ω·cm was obtained by the Czochralski method. In accordance with the procedure of FIG. 1, the ingot was sliced into wafers through use of a wire saw, the peripheral edges of the wafers were chamfered, and then the chamfered wafers were lapped to obtain lapped wafers.

An aqueous solution which contained sodium hydroxide in a concentration of 51.2% was prepared as an etchant. The etchant was placed in an etching bath, which was then heated to a temperature of 80° C. The above lapped wafers were immersed in the etching bath which was maintained at a temperature of 80° C., to thereby etch the wafers. The etching amount was 20 μm in terms of a total thickness for both sides of each of the wafers.

The thus-etched wafers were measured for surface roughness of chamfered portions thereof through use of a probe type surface roughness tester, SURFCOM (a trade name, manufactured by Tokyo Seimitsu Co., Ltd.). The results are shown in Table 1.

Comparative Example

An aqueous solution which contained sodium hydroxide in a concentration of 50.2% was prepared as an etchant.

This etchant was placed in an etching bath, which was then heated to a temperature of 80° C. Lapped wafers identical to those used in the above-described Example were immersed in the etching bath which was maintained at a temperature of 80° C., to thereby etch the wafers in an amount of 20 μm in terms of a total thickness for both sides of each of the wafers (Etching was performed under the same conditions as those of the Example except for the alkali concentration of the etchant.).

The thus-etched wafers were measured for surface roughness of chamfered portions thereof through use of the probe type surface roughness tester, SURFCOM (a trade name, manufactured by Tokyo Seimitsu Co., Ltd.).

The results, together with those of the Example, are shown in Table 1. In Table 1, Ra denotes a mean value of surface roughness, and Rmax denotes a maximum value of surface roughness.

TABLE 1

|  | Example | Comparative Example |
| --- | --- | --- |
| Sodium hydroxide concentration (wt. %) | 51.2 | 50.2 |
| Number of wafers | 79 | 135 |
| Mean value of Ra (μm) | 0.26 | 0.39 |
| Standard deviation of Ra | 0.104 | 0.190 |
| Mean value of Rmax (μm) | 2.83 | 4.45 |
| Standard deviation of Rmax | 0.901 | 2.272 |

As seen from Table 1, through use of the etchant which was only 1% higher in sodium hydroxide concentration than the etchant of the Comparative Example, surface roughness of chamfered portions, particularly dispersion in a maximum value thereof, could be managed to reduce significantly.

A difference in the sodium hydroxide concentration did not cause any variation in the shape of chamfered portions.

The present invention is not limited to the above-described embodiments. The above-described embodiments are mere examples, and those having the substantially same structure as that described in the appended claims and providing the similar action and effects are included in the scope of the present invention.

The above embodiments are described while mentioning etching intended to eliminate mechanical damage in the lapping and preceding steps. The present invention is not limited thereto, but may be applicable to any kind of etching so long as semiconductor silicon wafers are concerned.

For example, the present invention can be applied to various kinds of etching in which the roughness of a finished surface and dispersion in the roughness must be reduced. Examples of such etching include etching of a silicon wafer surface in a device step, etching of a thin film on a silicon wafer, and other kinds of etching on a silicon wafer.

An etching method of the present invention encompasses not only a method wherein silicon wafers are entirely immersed in an etchant but also, for example, a method wherein only surfaces or required portions of silicon wafers are brought in contact with an etchant.

What is claimed is:

1. A silicon wafer etching method comprising the steps of:
    preparing an alkali aqueous solution which contains an alkali component in a concentration ranging from 50.6% to 55.0% by weight; and
    etching a silicon wafer while using said alkali aqueous solution as an etchant.

2. A silicon wafer etching method according to claim 1, wherein said alkali component is sodium hydroxide.

3. A silicon wafer etching method according to claim 1, wherein the temperature of said etchant falls in a range from 65° C. to 85° C.

4. A silicon wafer etching method according to claim 2, wherein the temperature of said etchant falls in a range from 65° C. to 85° C.

5. A silicon wafer etching method according to claim 1, wherein etching is performed such that the thickness of silicon removed by the etching falls in a range of 15 μm to 40 μm in terms of a total thickness for both sides of a wafer.

6. A silicon wafer etching method according to claim 2, wherein etching is performed such that the thickness of silicon removed by the etching falls in a range of 15 μm to 40 μm in terms of a total thickness for both sides of a wafer.

7. A silicon wafer etching method according to claim 3, wherein etching is performed such that the thickness of silicon removed by the etching falls in a range of 15 μm to 40 μm in terms of a total thickness for both sides of a wafer.

8. A silicon wafer etching method according to claim 4, wherein etching is performed such that the thickness of silicon removed by the etching falls in a range of 15 μm to 40 μm in terms of a total thickness for both sides of a wafer.

9. A silicon wafer etchant comprising an alkali aqueous solution which contains an alkali component in a concentration ranging from 50.6% to 55.0% by weight.

10. A silicon wafer etchant according to claim 9, wherein said alkali component is sodium hydroxide.

* * * * *